(12) United States Patent
Albright

(10) Patent No.: US 6,311,201 B1
(45) Date of Patent: Oct. 30, 2001

(54) EFFICIENT LOW PASS FILTER STAGE FOR A DECIMATION FILTER

(75) Inventor: Keith S. Albright, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 715 days.

(21) Appl. No.: 08/536,768

(22) Filed: Sep. 29, 1995

(51) Int. Cl.[7] .................................................. G06F 17/17
(52) U.S. Cl. .................................................................. 708/313
(58) Field of Search ......................... 364/724.1; 708/300, 708/301, 313

(56) References Cited

U.S. PATENT DOCUMENTS

| | | | |
|---|---|---|---|
| 4,872,129 | * 10/1989 | Pfeifer et al. | 364/724.1 |
| 5,043,933 | * 8/1991 | Boutaud et al. | 364/724.1 |
| 5,079,734 | * 1/1992 | Riley | 364/724.1 |
| 5,212,659 | * 5/1993 | Scott et al. | 364/724.1 |
| 5,455,782 | * 10/1995 | Young et al. | 364/724.1 |
| 5,517,529 | * 5/1996 | Stehlik | 375/316 |
| 5,541,864 | * 7/1996 | Van Bavel et al. | 364/724.1 |

OTHER PUBLICATIONS

Leung, B., "The Oversampling Technique for Analog to Digital Conversion: A Tutorial Overview," *Analog Integrated Circuits and Signal Processing 1*, Kluwer Academic Publishers, Boston, 1991, pp. 65–74.

Rebeschini et al., "A High–Resolution CMOS Sigma–Delta A/D Converter with 320 KHz Output Rate," IEEE Proceedings, ISCAS, 1989, pp. 246–249.

Alexander et al., "A 192ks/s Sigma–Delta ADC with Integrated Decimation Filters Providing –97.4dB THD," Digest of Technical Papers, 1994 IEEE International Solid–State Circuits Conferenc pp. 190–191.

Hogenauer, Eugene B., "An Economical Class of Digital Filters for Decimation and Interpolation," IEEE Transactions on Acoustics, Speech, and Signal Processing, vol. ASSP–29, No. 2, Apr. 1981, pp. 155–162.

* cited by examiner

Primary Examiner—Emmanuel L. Moise
(74) *Attorney, Agent, or Firm*—Robert D. Lott; Steven Lin

(57) ABSTRACT

A decimation filter has a low pass first stage of filtering in which multiple taps from a plurality of delay stages are summed together and then integrated to thereby provide suppression of high frequency noise in the input signal.

25 Claims, 4 Drawing Sheets

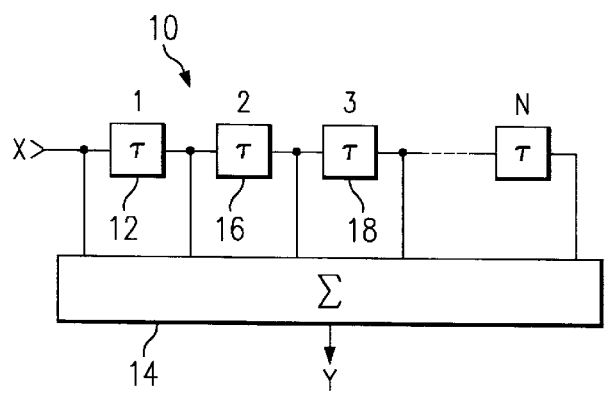
FIG. 1
(PRIOR ART)
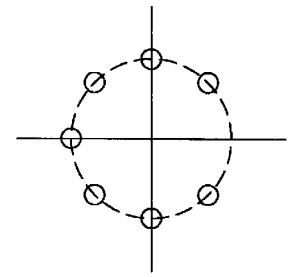
FIG. 2
(PRIOR ART)
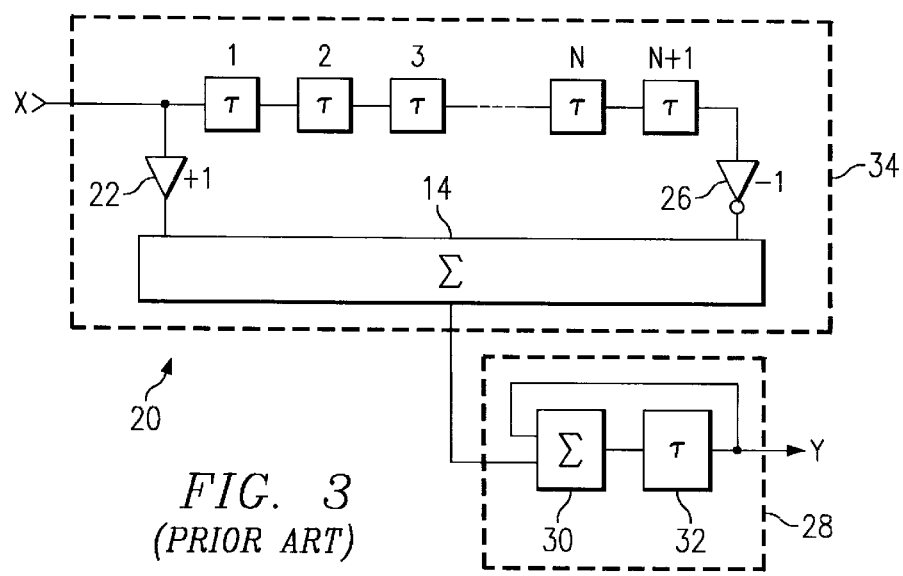
FIG. 3
(PRIOR ART)
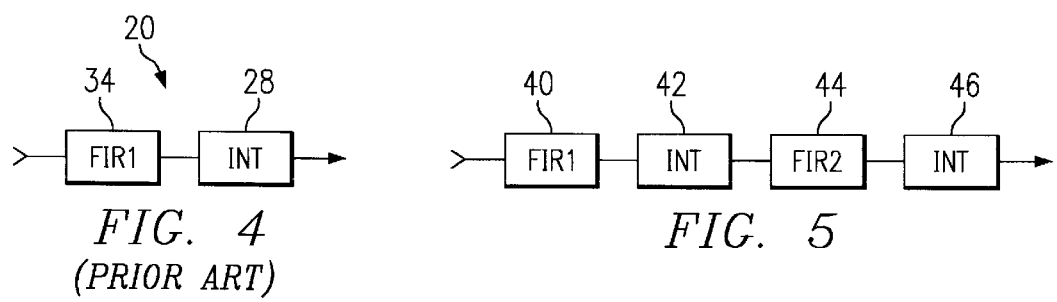
FIG. 4
(PRIOR ART)
FIG. 5

EFFICIENT LOW PASS FILTER STAGE FOR A DECIMATION FILTER

TECHNICAL FIELD OF THE INVENTION

The present invention pertains to decimation filters, and, more particularly, to low pass filtering in decimation filters.

BACKGROUND OF THE INVENTION

Decimation filters are used to convert a relatively high speed serial data stream, such as from a delta sigma modulator, and to a slower bit rate, wide word data. In the process of this decimation, certain advantageous filtering operations also occur.

One problem which is present in prior art decimation filters is that noise at frequencies above the base signal are aliased into the base signal, and once the noise is aliased into the base signal, it cannot be removed by conventional filtering techniques.

It can therefore be appreciated that a decimation filter which efficiently filters high frequency noise is highly desirable.

SUMMARY OF THE INVENTION

It is, therefore, an object of this invention to provide a decimation filter which efficiently filters high frequency noise.

Shown in an illustrated embodiment of the invention is a stage of a decimation filter which provides a filtering operation with multiple zeros at multiple frequencies and which operates at the highest sample rate of the decimator.

Further shown in an illustrated embodiment of the invention is a stage of a decimation filter in which a serial data input stream is filtered by summing the true or complement of selected bits of the data stream during each sampling period to provide a multiple zero filter characteristic.

BRIEF DESCRIPTION OF THE DRAWINGS

The aforementioned and other features, characteristics, advantages, and the invention in general will be better understood from the following more detailed description taken in conjunction with the accompanying drawings, in which:

FIG. 1 is a prior art filter of a type which can be used in decimation filters;

FIG. 2 is another prior art filter of a type which can be used in decimation filters;

FIGS. 3–7 show the progression from the prior art filter of FIG. 2 to the present invention;

Figure 6:
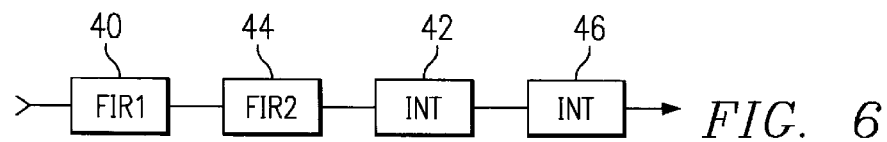

It will be appreciated that for purposes of clarity and where deemed appropriate, reference numerals have been repeated in the figures to indicate corresponding features.

DETAILED DESCRIPTION

A stage of a decimation filter according to the preferred embodiment of the present invention uses a multiple pole band stop filter operating at the highest sampling frequency of the decimation filter to provide low pass filtering to filter out signal noise which is above the base signal of the input signal. By filtering this noise before the decimation process, this high frequency noise does not get aliased back into the base signal during the decimation process.

FIG. 1 is a block diagram of a prior art digital filter 10. an input signal, X, is connected to a first delay stage 12 and also to one input of a summer, 14. The output of the first delay stage 12 is connected to a second delay stage, 16, and to another input of the summer, 14. The output of the second delay stage 12 is connected to a third delay stage, 18, and to another input of the summer, 14. In this manner N delay stages are connected in series and the output of each of the N delay stages is connected to the summer, 14. In the preferred embodiment each of the delay stages is realized with a D latch which is clocked by the sampling frequency.

The transfer function for the circuit of FIG. 1 is $$H(Z) = \frac{Y(Z)}{X(Z)} = 1 + Z^{-1} + Z^{-2} + Z^{-3} + \cdots + Z^{-N} \quad \text{(Equation 1)}$$

This transfer function has N zeros which are located on the unit circle in the Z plane. FIG. 2 shows the position of the zeros for an N=7 filter. The frequency of the first zero is $$\frac{f_s}{N+1}.$$

FIG. 3 shows a modified filter, 20. In this filter the input X is summed with the complement of the output of the N+1 delay circuit. Thus the X input is passed through a noninverting unity gain amplifier 22, the output of which is connected to one input of the summing circuit 14. The X input is a also passed through N+1 delay circuits, 24. The output of the N+1 delay circuit is connected to the input of an inverting unity gain amplifier, 26, the output of which is connected to the summing circuit 14. The output of the summing circuit is passed through an integrator, 28. The integrator 28 includes a two input summing circuit, 30, and another delay circuit, 32, which are connected in the conventional manner to achieve the integration function.

The transfer function for the circuit of FIG. 3 is $$H(Z) = \frac{Y(Z)}{X(Z)} = \frac{1 - Z^{-(N+1)}}{1 - Z^{-1}} = 1 + Z^{-1} + Z^{-2} + Z^{-3} + \cdots + Z^{-N}$$

which is the same result as equation 1. Therefore the circuits of FIGS. 1 and 3 provide the same filtering characteristics.

The portion of the circuit 20 which is within the dashed box 34 is a finite impulse response (FIR) filter. Therefore, FIG. 3 can be shown as the series connection of two circuit blocks, a FIR filter, 34, and an integrator (INT), 28, as shown in FIG. 4. FIG. 5 is a block diagram of two of the types of filters of FIG. 4 cascaded together to form a series connection of a first FIR filter (FIR1), 40, an integrator 42, a second FIR filter (FIR2), 44, and another integrator, 46. These blocks of FIG. 5 can be reordered without changing the transfer function. FIG. 6 shows such a reordering. Moreover, the two FIR filters 40 and 44 can be combined using convolution to form a new FIR filter 50 as shown in FIG. 7.

Figure 7:
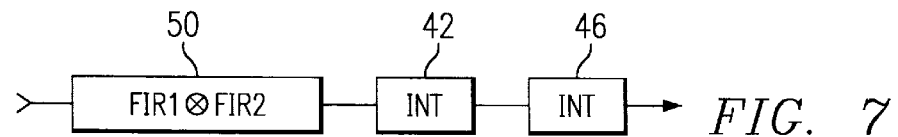

The filter of FIG. 7 has the zeros of both FIR1 and FIR2. It is advantageous to make the zeros of FIR1 and FIR2 at different locations. For example assume that the transfer functions of FIR1 and FIR2 are

FIR1=1+Z$^{-1}$+Z$^{-2}$+Z$^{-3}$+Z$^{-4}$+Z$^{-5}$+Z$^{-6}$

FIR2=1+Z$^{-1}$+Z$^{-2}$+Z$^{-3}$+Z$^{-4}$+Z$^{-5}$+$^{-6}$+Z$^{-7}$

The FIR1, if realized in the circuit shown in FIG. 3, would have 9 delay stages, and the true output of the first delay stage would be summed with the complement of the output of the 9th delay stage. Similarly, the FIR2 if realized in the circuit shown in FIG. 3, would have 8 delay stages, and the true output of the first delay stage would be summed with the complement of the output of the 8th delay stage.

For a sampling frequency of 40 HZ=fs, the three possible convolution combinations of FIR1 and FIR2 provide the following peak stopband lobe and stopband leakage characteristics:

| Combination | Peak Stopband Lobe | Stopband Leakage |
|---|---|---|
| FIR1 ⓧ FIR1 | 0.0525 | 0.1668 |
| FIR2 ⓧ FIR2 | 0.0543 | 0.2046 |
| FIR1 ⓧ FIR2 | 0.0486 | 0.1312 |

The combination of FIR1 and FIR2, with non-redundant zeros, has lower stopband sidelobes and less stopband leakage than the other two combinations.

Figure 8:
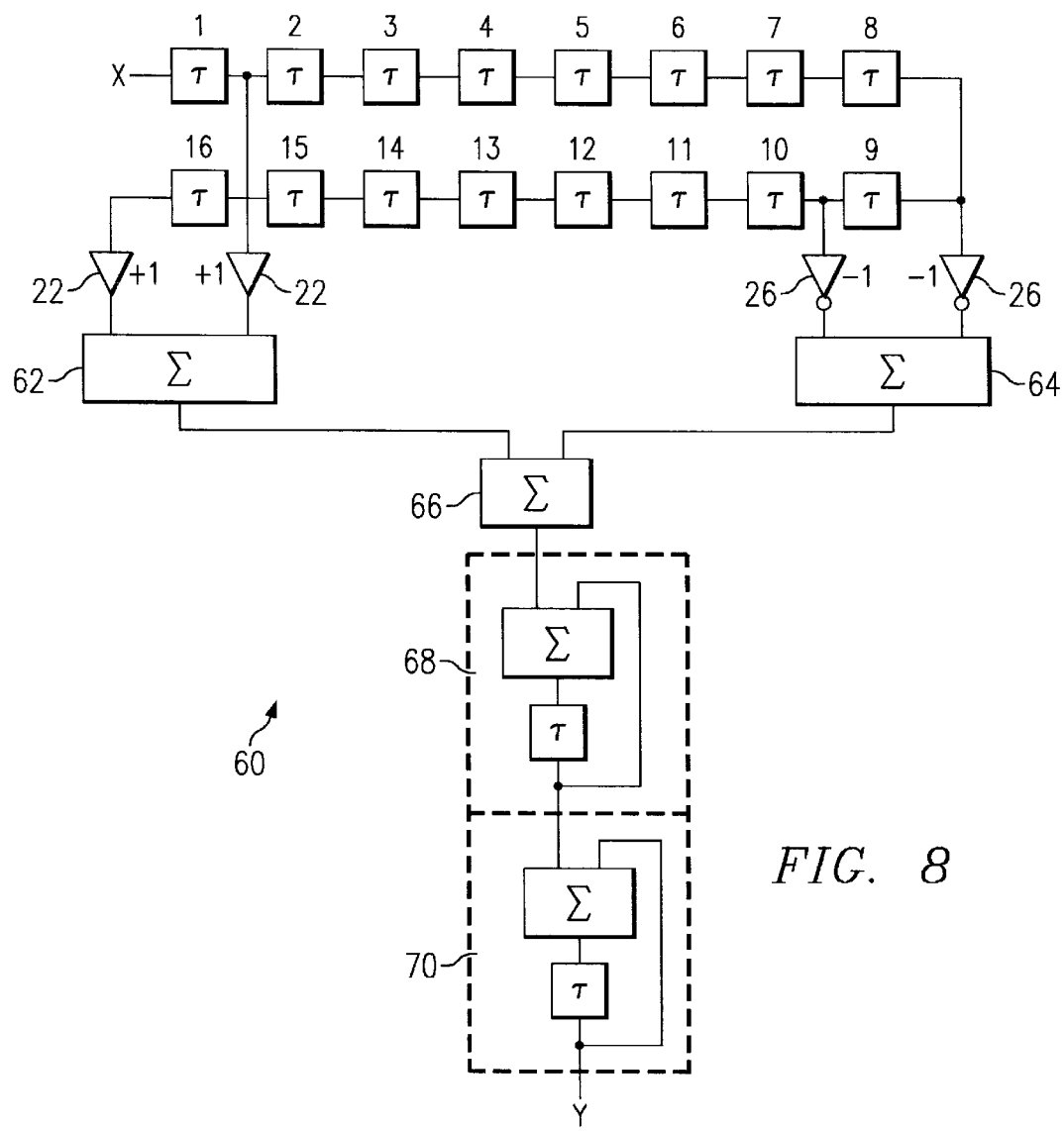
FIG. 8 is a block diagram of the circuit of FIG. 7.
Figure 9:
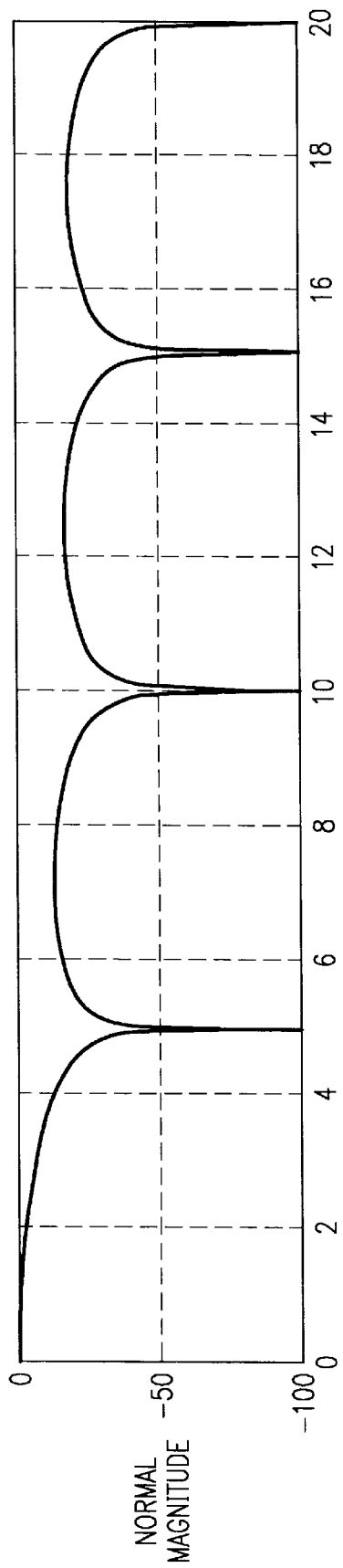
FIGS. 9 and 10 are graphical representations of the response of the filter shown in FIG. 8.
Figure 10:
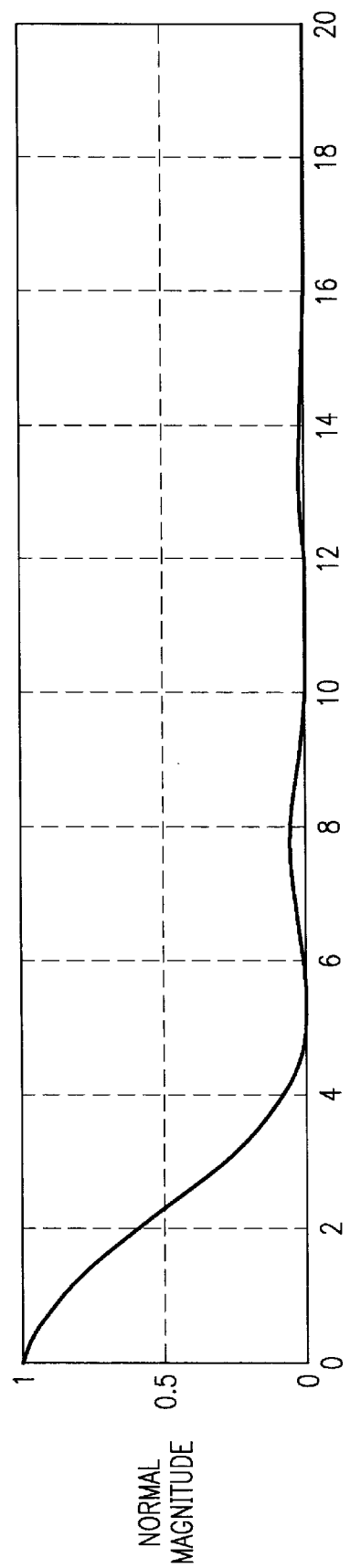

FIG. 8 is a block diagram of a low pass filter 60 of the example used above. The X input, a single serial bit stream, is passed through 16 delay stages and the true output of the first and 16th stages are summed together in a summer 62, while the complement of the outputs of the 8th and 9th delay stages are summed together in a summer 64. The outputs of the summers 62 and 64 are summed together in another summer 66. (Of course, the summers 62, 64, and 66 can be combined into a single summer.) The output of the summer 66 is then processed through two integrators 68 and 70. FIGS. 9 and 10 are graphical representations of the response of the filter circuit 60. The graphs show frequency (FREQ) plotted against the gain of the filter in db in FIG. 9, and against the gain of the filter in linear magnitude in FIG. 10. In both figures the magnitude of the gain is a normalized magnitude (Norm Mag).

Those skilled in the art will appreciate that the filtering operation which occurs in the delay stages and the input to the summers 62 and 64 of FIG. 8 are operations on single bit wide data busses, while all of the circuitry after the summers 62 and 64 are multi-bit wide buss circuitry. Therefore, the combination of FIG. 5 would require that the second FIR filter 44 be a multi-bit wide filter and would therefore require much more complicated circuitry than that required by the filter of FIG. 7. The circuitry of FIG. 8, because it receives single bit serial data, must operate before the decimation stages of the decimation filter.

Figure 11:
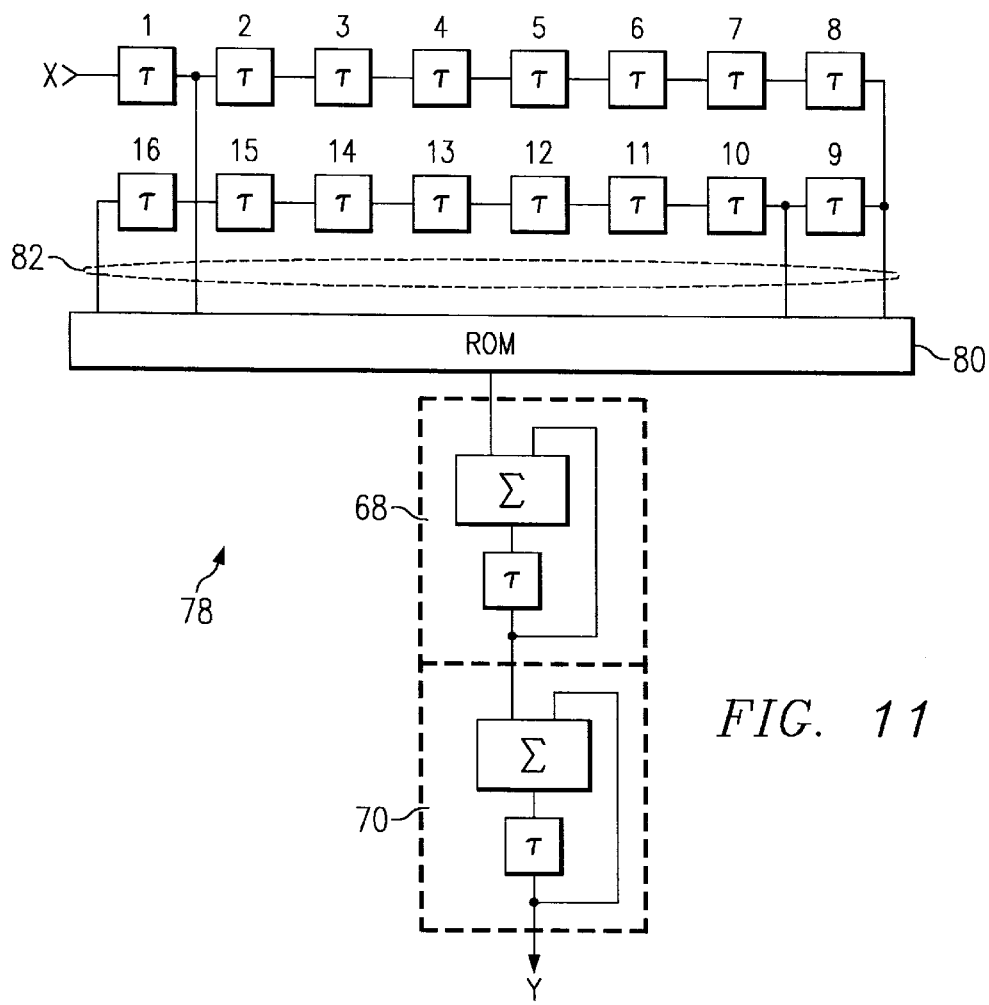
FIG. 11 is an alternative embodiment of the present invention.

FIG. 11 is another embodiment of a filter, 78, according to the present invention and which is the circuit of FIG. 8 with a read only memory (ROM),80, used in place of the summers 62, 64, and 66. In this embodiment the ROM 80 receives four address signals on lines 82 from the delay stages. The ROM output is data which is then processed in the integrators 68 and 70. The advantage of the ROM 80 is that it is very area and power efficient.

Figure 12:
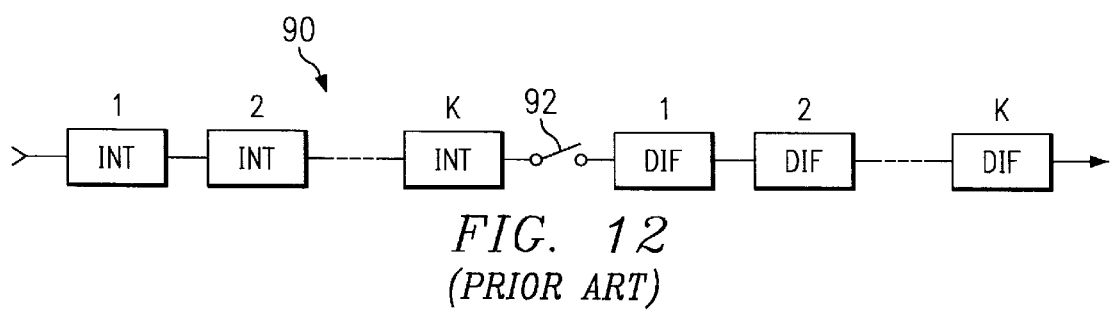
FIG. 12 is a block diagram of a cascaded integrator comb (CIC) filter which may be used in one embodiment of the present invention; and, FIG. 13 is a block diagram of the present invention which includes the CIC filter of FIG. 8.

The filter circuits of FIGS. 7, 8, and 11 can be followed by a cascaded integrator comb (CIC) filter that adds another set of zeroes to the transfer function. However, increasing the order of the CIC filter just adds repeated zeros to those of a lesser order CIC filter. FIG. 12 is a block diagram of a CIC filter, 90. The filter comprises K integrator stages followed by a decimator, shown symbolically as a switch 92.

After the decimator 92 are K stages of differentiation. The CIC filter of FIG. 12 has a transfer function of $$H(Z) = \left| \frac{1 - Z^{-R}}{1 - Z^{-1}} \right|^K$$

Therefore, increasing K does not produce additional unique where R is the integer rate change factor which is equal to the sampling frequency divided by the frequency of the comb section. zeros.

Figure 13:
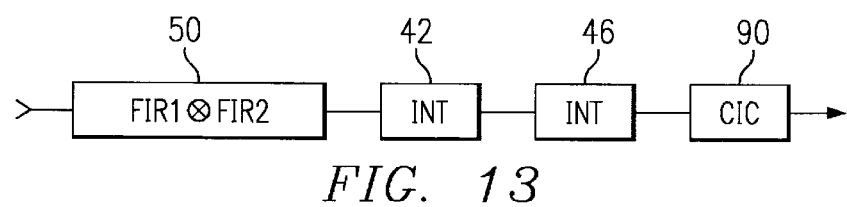

FIG. 13 is the combination of FIGS. 7 and 12. The CIC filter must be the last stage of filtering since it reduces the sample rate. The previous stages require the higher rate samples.

Although the invention has been described in part by making detailed reference to a certain specific embodiment, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein.

What is claimed is:

1. A method for digitally filtering a bit stream signal of one bit wide comprising the steps of:

a) delaying said bitstream signal in a plurality of serially connected delay stages;

b) summing together the true or complement of a selected group of said delay stages to form a summed signal, said group being greater than two; and, c) integrating said summed signal in a plurality of integration stages to form a filtered output signal.

2. A method for digitally filtering a bit stream signal of one bit wide comprising the steps of:

a) delaying said bit stream signal in a plurality of serially connected delay stages;

b) addressing a ROM with a selected group of said delay stages, said group being greater than two; and, c) integrating an output of said ROM in a plurality of integration stages to form a filtered output signal.

3. Apparatus comprising a series connection of delay stages having an input terminal for receiving an input signal and an output terminal, wherein a select group of the true and complementary signals derived from the nodes of said series connection of delay stages are combined together in a combination circuit to provide a summed signal, said summed signal coupled to an input terminal of an integration stage comprising a plurality of integrators wherein an output terminal of said plurality of integrators provides an output signal which is a filtered version of said input signal.

4. The apparatus set forth in claim 3 wherein said combination circuit is a summing circuit.

5. The apparatus set forth in claim 3 wherein said combination circuit is a ROM.

6. The apparatus set forth in claim 3 wherein said plurality of integrators are serially connected.

7. The apparatus set forth in claim 3 wherein data path through said series connection of delay stages is one bit wide.

8. The apparatus set forth in claim 3 wherein said filtered version is a low pass filtered version.

9. The apparatus set forth in claim 3 wherein said output signal and said input signal are at the same sample rate.

10. Apparatus comprising a series connection of delay stages having an input terminal for receiving an input signal and an output terminal, wherein a select group of the true and complementary signals derived from the nodes of said series connection of delay stages are summed together to provide a summed signal, said summed signal coupled to an input terminal of an integrator stage comprising a plurality of integrators wherein an output terminal of said plurality of integrators provides an output signal such that said output signal divided by said input signal is characterized by a filter response having zeros at frequencies which are not all related to each other by a factor of X/Y where X and Y are integers, and wherein said output signal is coupled to the input of a decimation stage which has a decimated output signal.

11. The apparatus set forth in claim 10 wherein said combination circuit is a summing circuit.

12. The apparatus set forth in claim 10 wherein said combination circuit is a ROM.

13. The apparatus set forth in claim 10 wherein said plurality of integrators are serially connected.

14. The apparatus set forth in claim 10 wherein data path through said series connection of delay stages is one bit wide.

15. The series connection of delay stages set forth in claim 10 wherein filter response is a low pass filter response.

16. The apparatus set forth in claim 10 wherein said output signal and said input signal are at the same sample rate.

17. A low pass discrete time filter comprising:
   a) a plurality of serially connected delay stages having an input terminal for receiving an input signal;
   b) a means for detecting the state of signals at selected nodes of said serially connected delay stages and for generating a sum signal which corresponds to the sum of one of the true or complement signals present at said selected nodes;
   c) a series combination of two or more integrator stages which receives said sum signal and which provides an output signal which is proportional to said input signal after it has been low pass filtered; and,
   d) a decimation stage which has an input terminal coupled to said output signal and an output terminal.

18. The low pass discrete time filter set forth in claim 17 wherein said delay stages are all one bit wide.

19. The low pass discrete time filter set forth in claim 17 wherein said selected nodes includes said input terminal and an output terminal of a last delay stage in said plurality of serially connected delay stages.

20. The low pass discrete time filter set forth in claim 17 wherein said output signal and said input signal are at the same sample rate.

21. In a discrete time low pass filtering process which includes the steps of integrating, summing, delaying, and decimating a data bit stream, wherein said summing step comprises summing one of the true or complement signals at a selected plurality of nodes of a delay circuit used to perform the delaying step, the improvement comprising integrating more than once in a plurality of serially connected integrators.

22. The discrete time low pass filtering process set forth in claim 21 wherein said integration step occurs after said summing step.

23. The discrete time low pass filtering process set forth in claim 21 wherein said data bit stream into said delay circuit is one bit wide.

24. The discrete time low pass filtering process set forth in claim 17 wherein said summing step is performed by adding together binarily said one of the true or complement signals at said selected plurality of nodes.

25. The discrete time low pass filtering process set forth in claim 17 wherein said summing step includes summing three or more of said plurality of nodes.

* * * * *